United States Patent [19]

Waldsmith

[11] Patent Number: 5,070,603

[45] Date of Patent: Dec. 10, 1991

[54] METHOD OF SEPARATING MULTI-LAYER PRINTED CIRCUIT WIRING BOARDS

[75] Inventor: Gary R. Waldsmith, Pilot Hill, Calif.

[73] Assignee: The United States of America as represented by the Secretary of the Air Force, Washington, D.C.

[21] Appl. No.: 648,071

[22] Filed: Jan. 31, 1991

[51] Int. Cl.$^5$ .............................................. H05K 3/00
[52] U.S. Cl. .................................. 29/829; 29/426.4; 29/426.5; 156/344
[58] Field of Search ............... 156/344; 29/829, 426.1, 29/426.4, 426.5

[56] References Cited

U.S. PATENT DOCUMENTS

| 4,623,255 | 11/1986 | Suszko | 356/389 |
| 4,766,516 | 8/1988 | Ozdemir et al. | 361/380 |
| 4,956,042 | 9/1990 | Hubert et al. | 156/344 |
| 4,963,205 | 10/1990 | Hubert | 156/344 |
| 4,969,247 | 11/1990 | Rossi | 29/426.5 |

FOREIGN PATENT DOCUMENTS 248133 10/1988 Japan .................................. 156/344

*Primary Examiner*—P. W. Echols
*Attorney, Agent, or Firm*—Jacob N. Erlich; Donald J. Singer

[57] ABSTRACT

A method of separating/splitting multi-layer printed circuit wiring boards by immersing the board and the blade of a surgical knife into liquid nitrogen to lower their temperatures to that of the liquid nitrogen thereby altering the holding properties of the adhesive material between the layers of the multi-layer board. Separating one layer at a time from the printed circuit wiring board until all layers of the multi-layer board have been removed.

10 Claims, No Drawings

METHOD OF SEPARATING MULTI-LAYER PRINTED CIRCUIT WIRING BOARDS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to a method of separating printed circuit wiring boards and, more particularly, to a method of cryogenically separating multi-layer printed circuit wiring boards without damaging the printed circuit on the individual layers.

The state of the art of printed circuit wiring board separation is well represented and alleviated to some degree by the prior art apparatus and approaches which are contained in the following U.S. Patents:

U.S. Pat. No. 4,623,255 issued to Suszko on Nov. 18, 1986; and

U.S. Pat. No. 4,766,516 issued to Ozdemir et al on Aug. 23, 1988.

The Suszko patent is an example of the multi-layer nature of printed circuit wiring boards. The examination of microstructures of LSI and VLSI devices is facilitated by employing a method in which the device is photographed through a darkfield illumination optical microscope and the resulting negative subjected to inverse processing to form a positive on a photographic film. The film is then developed to form photographic prints or transparencies which clearly illustrate the structure of the device. The entire structure of a device may be examined by alternately photographing the device and selectively etching layers of the device in order to expose underlying layers.

The Ozdemir et al patent discusses the method and apparatus for securing integrated circuits from unauthorized copying and use wherein at least one additional circuit element that does not contribute toward the integrated circuit's circuit function, but inhibits proper functioning of the integrated circuit in case of an attempted copying or other unauthorized use. The identity of the additional circuit elements is disguised by the visible appearance of an apparent element but with a physical modification which is not readily visible but causes them to function in a different manner, by providing different ICs with unique control codes, or both. Physical modifications not readily visible to a copyist include very narrow open circuit cuts in metalized connection lines, preferably with a focused ion beam or laser beam; and/or disordering the lattice structure or changing the doping level of a semiconductor region, and/or injecting electrical charge into a semiconductor region, preferably with an electron beam. The additional elements can be formed into a control code subcircuit for the IC, with the code disguised by the us of apparent elements.

Many older printed circuit wiring boards are lacking the necessary data for reproducing large quantities of these boards during surge requirements. In many cases, the companies that produced the boards originally are no longer in business or no longer possess the engineering data to manufacture the printed circuit wiring boards again. The only alternative is to reverse engineer an existing printed circuit wiring board. This usually can be accomplished, however, it generally involves a very large cost expenditure in both time and manpower.

Thus, it is quite clear that there exists a critical need to find a fast, cost-effective way to reproduce the needed engineering data to reproduce and manufacture new printed circuit wiring boards.

It is therefore very critical in the reproduction and duplication of older printed circuit wiring boards, particularly boards which are multi-layered, that an accurate specimen or model of an original board be produced. The separation of multi-layered printed circuit wiring boards poses a number of great difficulties in the process of obtaining an accurate model of an out of production board. The process of separating or splitting a multi-layered board may totally destroy the only existing board of a particular type or class. It is therefore quite clear that there is a great need to provide a method of separating multi-layered printed circuit wiring boards accurately and without damage to any of the separated layers.

While the above-cited references are instructive, there still remains a need to provide a method of cryogenically separating/splitting multi-layer printed circuit wiring boards to provide a reproducible model in order to produce an exact replica of the original board. The present invention is intended to satisfy that need

SUMMARY OF THE INVENTION

The present invention is a method of cryogenically separating/splitting multi-layered printed circuit wiring boards to produce individual board layers from which finished artwork that is exactly identical to the original may be obtained. The cryogenic method is utilized to cool the multi-layered board to the point where the adhesive binding properties of the material that is holding the multi-layers together is altered to the point of allowing physical separation of the individual layers.

It is one object of the present invention, therefore, to provide an improved method of separating multi-layer printed circuit wiring boards.

It is another object of the invention to provide an improved method of separating multi-layer printed circuit wiring boards to provide an exact reproducible specimen of each board layer for the original multi-layer printed circuit wiring board.

It is still another object of the invention to provide an improved method of separating multi-layer printed circuit wiring boards wherein the bonding material between the multi-layers of the wiring board is cryogenically altered to allow the physical separation of the individual board layers.

It is yet another object of the invention to provide an improved method of separating multi-layer printed circuit wiring boards wherein undamaged and photographically reproducible board layers are obtained from multi-layered printed circuit wiring boards.

These and other advantages, objects and features of the invention will become more apparent after considering the following description taken in conjunction with the illustrative embodiment in the detailed description of the preferred embodiment.

DETAILED DESCRIPTION OF THE PREFERRED EMBODIMENT

The method of separating or splitting a multi-layer printed circuit wiring board into individually, undamaged board layers is accomplished by the careful execution of the following method steps. Since the separation/splitting procedure involves the use of a cryogenic cooling substance, such as liquid nitrogen (LN2) the following precautions are suggested and necessary. Some form of eye protection must be used when working with a cryogenic cooling substance such as liquid nitrogen. While the eye protection may be any suitable commercially available protection, it should be noted that jeweler's binocular with a magnification power of 10X has been utilized effectively.

Since the procedure for separating/splitting multi-layer printed circuit wiring boards involves the use of materials that are cooled to extremely low temperatures, it is recommended that suitable leather gloves be worn by the method operator in order to protect ones fingers and hands from the extreme cold. Furthermore, the cryogenic cooling substance should be carefully stored in suitably sturdy containers to prevent accidental injury to operating personnel. In the situation where liquid nitrogen is utilized as the cooling substance, styrofoam containers may be utilized to process larger printed circuit wiring boards when one is unable or it is difficult to find or acquire a container of the proper shape to hold and process layer circuit boards.

The method of separating/splitting multi-layer printed circuit wiring boards is accomplished as follows:

1. Place the area of interest of the multi-layer board which is to be separated/split into a container containing a cryogenical cooling substance, such as liquid nitrogen, LN-2.

a. Ensure that this area is completely involved or covered by the cryogenic cooling substance.

b. The printed circuit wiring board will add heat into the cryogenic cooling system as it is cooled. This added heat will cause the cryogenic cooling substance to boil until the board and the cryogenic cooling substance are at the same temperature. At this point, the multi-layer board has been cooled to the point where the hold or binding properties of the adhesive material between the multi-layers has been altered so as to permit the physical separation of the individual board layers.

c. Place the board separating utensile (i.e., a surgical knife) into the cryogenic cooling substance to cool the tip of the knife at the same time simultaneously with the board so that both will be substantially the same temperature.

2. Remove both the printed circuit wiring board and the surgical knife from cryogenic cooling substance at the termination of boiling.

3. In preparation of the board separation procedure, hold the board at an appropriate angle and proceed to split the first layer away from the main body of the board.

a. Take extreme care to ensure that you only separate off the one layer. Do not include any of the next group of sublayers of material which make up the board's separating or insulating material between circuits.

b. It will be necessary to recool the blade and the board as often as needed during the separation process. This point will be easily recognized by increased degree of difficulty in separating the board layers.

c. This process should be repeated as often as needed to slowly separate off this first layer.

It is important to note that the bonding medium which is holding the different layers together will become stronger as the circuit board warms up. It is imperative that a person develops a feel for this characteristic by practicing this process so that they will know when to recool the board and knife blade before the board starts to tear or split.

4. The separation process will proceed slowly until a plated through copper mounting hole is encountered. To easily separate the board around the plated through hole any of the following steps or procedures may be utilized:

a. Insert a drill bit one or two thousand larger than the hole diameter to remove the copper plating.

b. On the larger holes, a pointed long tapered round jewelers' file may be used to remove a portion of the copper collars' edge at the board/hole intersection.

c. The separation process may also be accelerated by using a small jeweler's screwdriver to pop loose these copper collars on the board. With the screwdriver next to the hole slowly rock the blade of screwdriver back and forth and the collar will pop loose.

d. If the above steps or methods do not break loose the board/hole interface it is necessary to use the smallest cutting chisel as possible and gently tap the chisel through the copper. At this point, it is essential to insure that the chisel tip is precooled before using or repeating this step of chiseling through a copper rivet or plated through hole.

5. This process cannot be rushed. Trying to speed the process may result in damaged and un-usable circuit board layers. The whole process is a slow one, and practice by the technician is essential to develop a feel for the recooling intervals.

6. After the first layer has been separated from the printed circuit wiring board, proceed to the next layer and repeat the process until all the layers are separated from each other.

An example of the types of tools which are needed to accomplish the procedure for multi-layer board separation are listed below:

10X Jewelers' Binoculars
Styrofoam container
Surgical knife with replaceable blades
Leather gloves
Hammer, small
Jewelers' screwdrivers' (one set)
Jewelers' files' (one set)
Jewelers' chisels' (one set)

Although the invention has been described with reference to a particular embodiment, it will be understood to those skilled in the art that the invention is capable of a variety of alternative embodiments within the spirit and scope of the appended claims.

What is claimed is:

1. A method of separating/splitting multi-layer printed circuit wiring boards comprising the steps of:
   a) filling a container with a cryogenic cooling substance,
   b) immersing a multi-layer printed circuit wiring board in said cryogenic cooling substance, to reduce the bonding strength of the bonding material between the multi-layers of said printed circuit wiring board, to permit separation thereof,
   c) immersing the tip of a separating/splitting utensil in said cooling substance,
   d) removing both said printed circuit wiring board and said separating/splitting utensil from said cooling substance when boiling thereof is terminated,
   e) placing said printed circuit wiring board at an appropriate angle and utilizing said separating/splitting utensil to remove and separate a first layer of said multi-layer printed circuit wiring board from said printed circuit wiring board, f) continuing the separating/splitting operation until said bonding material between the multi-layers of said printed circuit wiring board begins to regain its bonding strength, g) repeating steps b through f until said first layer is completely separated from said printed circuit wiring board, h) repeating steps b through f for each layer of said multi-layer printed circuit wiring board until each additional layer of said printed circuit wiring board has been successfully removed.

2. A method of separating/splitting multi-layer printed circuit wiring boards, as recited in claim 1, wherein said separating/splitting utensil comprises a surgical knife.

3. A method of separating/splitting multi-layer printed circuit wiring boards, as recited in claim 1, wherein the following steps are to be utilized when a plated through hole is encountered during steps e through h:
 1. inserting a drill bit which is slightly larger than the hole, into the hole to remove the plating around and in the hole.

4. A method of separating/splitting multi-layer printed circuit wiring boards, as recited in claim 3, wherein said drill bit is one to two thousandths larger than said hold.

5. A method of separating/splitting multi-layer printed circuit wiring boards, as recited in claim 1, wherein the following steps are to be utilized when a plated through hole is encountered during steps e through h:
 1. using a pointed long tapered round jeweler's file to remove a portion of the hole's collar edge at the intersection of the hole and the board.

6. A method of separating/splitting multi-layer printed circuit wiring boards, as recited in claim 1, wherein the following steps are to be utilized when a plated through hole is encountered during steps e through h:
 1. using a small jeweler's screwdriver to pop loose the hole's collar on the board, by positioning the screwdriver next to the hole and slowly rocking the blade of the screwdriver back and forth until the collar pops loose.

7. A method of separating/splitting multi-layer printed circuit wiring boards, as recited in claim 1, wherein the following steps are to be utilized when a plated through hole is encountered during steps e through h:
 1. using a jeweler's cutting chisel and gently tapping the chisel through the hole plating.

8. A method of separating/splitting multi-layer printed circuit wiring boards, as recited in claim 7, wherein the top of the chisel is precooled before using in step 1.

9. A method of separating/splitting multi-layer printed circuit wiring boards, as recited in claim 1, wherein said cooling substance is a cryogenic cooling liquid.

10. A method of separating/splitting multi-layer printed circuit wiring boards, as recited in claim 9, wherein said cryogenic cooling liquid is liquid nitrogen.

* * * * *